United States Patent [19]

Ishida

[11] Patent Number: 4,601,015

[45] Date of Patent: Jul. 15, 1986

[54] JOSEPHSON MEMORY CIRCUIT

[75] Inventor: Ichiro Ishida, Tokyo, Japan

[73] Assignee: Nippon Electric Co., Ltd., Tokyo, Japan

[21] Appl. No.: 467,631

[22] Filed: Feb. 18, 1983

[30] Foreign Application Priority Data

Feb. 23, 1982 [JP] Japan .................. 57-27611
Feb. 23, 1982 [JP] Japan .................. 57-27612

[51] Int. Cl.$^4$ ........................................... G11C 11/44
[52] U.S. Cl. ...................... 365/162; 307/306
[58] Field of Search ............ 365/162; 357/5; 307/306

[56] References Cited

U.S. PATENT DOCUMENTS 4,130,893 12/1978 Henkels ................ 365/162

OTHER PUBLICATIONS

P. Wolf, "Two-Junction Josephson Memory", IBM Technical Disclosure Bulletin, vol. 16, No. 1, Jun. 1973, p. 214.

Primary Examiner—Joseph A. Popek
Attorney, Agent, or Firm—Sughrue, Mion, Zinn, Macpeak & Seas

[57] ABSTRACT

A Josephson memory circuit comprises a closed superconducting loop having a first node and including a first Josephson gate therein, and a first line connected to the node. The circuit also includes a second line provided to electromagnetically couple to the first Josephson gate, a second Josephson gate provided so close to the superconducting loop as to electromagnetically couple to the superconducting loop, and a third line connected to the second Josephson gate and provided to electromagnetically couple to the first Josephson gate.

8 Claims, 12 Drawing Figures

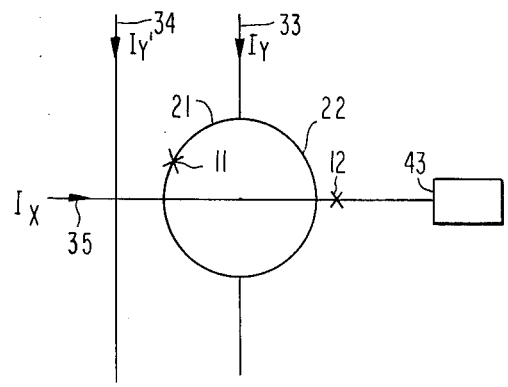
FIG. 1
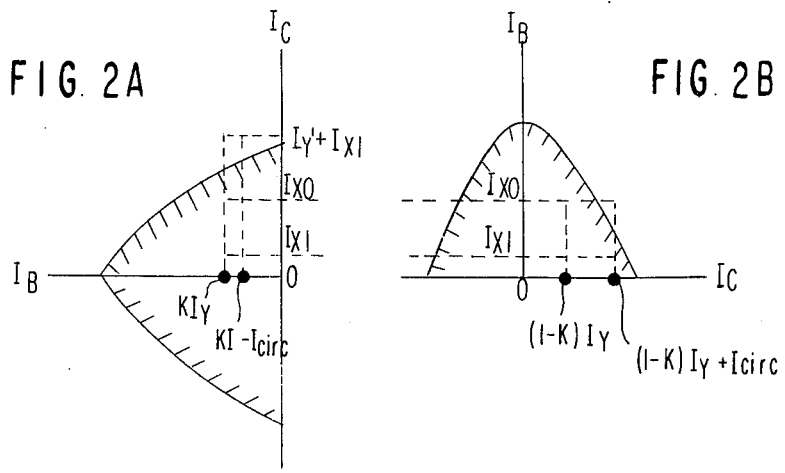
FIG. 2A
FIG. 2B
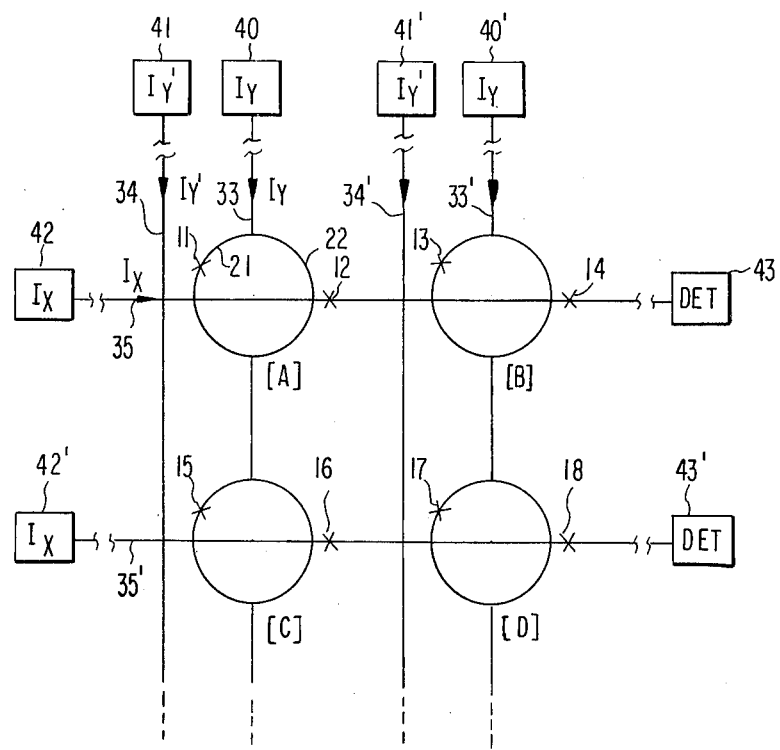
FIG. 3

JOSEPHSON MEMORY CIRCUIT

BACKGROUND OF THE INVENTION

The present invention relates to a Josephson memory circuit using Josephson gates and, more particularly, to a Josephson NDRO (NONDESTRUCTIVE READ-OUT) memory circuit adapted to store binary information represented by the presence/absence or direction of a persistent circulating current which is to flow through a superconducting loop having a Josephson gate therein.

In the past, some Josephson memory circuits have been proposed which feature a short access time and low power consumption. Typical of such Josephson memories may be the one described in a paper by W. H. Henkels entitled "Fundamental criteria for the design of high-performance Josephson nondestructive readout random access memory cells and experimental confirmation", J. Appl. Phys. 50 (12), December 1979, pp. 8143–8168, or the one described in a paper by W. H. Henkels and J. H. Greiner entitled "Experimental Single Flux Quantum NDRO Josephson Memory Cell," *IEEE JOURNAL OF SOLID-STATE CIRCUITS,* VOL. SC-14, No. 5, October 1979, pp. 794–796.

Basically, a Josephson memory circuit of the type described consists of cells arranged in a matrix. Each of the cells comprises a superconducting closed loop having one Josephson write gate therein and a Josephson sense gate which is disposed near the superconducting loop. The superconducting loops of the cells in the column direction are respectively connected in series through bias lines. Two independent control lines extend in the vicinity of the write gates in the row and column directions, respectively, in order to apply control magnetic fields to the write gates. A sense line is associated with the sense gate of each cell in the row direction so as to permit a read bias current to flow therethrough.

To write information into a cell, predetermined levels of currents are supplied to the bias line and the two control lines associated with the cell. The currents thus supplied allow the write gate to temporarily have a voltage state of a certain level (referred to hereunder as "voltage state") so that the bias current flows through one branch of the superconducting loop which does not include the write gate. Thereafter, the supply of the currents is cut off to hold in the superconducting loop a persistent circulating current which flows toward the above-mentioned one branch. To remove the circulating current, two control currents are supplied without supplying the bias current, so that the write gate is brought to the voltage state and the supply of the currents is interrupted.

For reading information out of the cell, the control characteristic of the sense gate is selected so that the sense gate is switched to the zero-voltage state or to the voltage state by a magnetic field due to the bias current which flows through the previously mentioned one branch in response to coincidence of the bias current and the read bias current, or by a magnetic field due to the sum of the bias current, the read bias current and the circulating current. Thus, information is read out by detecting a state of the sense gate.

As described above, however, the prior art Josephson memory circuit has a complicated construction because every cell needs one bias line, two control lines and one sense line and each of these lines must be provided with a power source. This is objectionable in the aspects of integration density, yield and uniformity in the characteristics of the products.

SUMMARY OF THE INVENTION

It is therefore an object of the present invention to provide a simplified Josephson memory circuit.

It is another object of the present invention to provide a Josephson memory circuit with reduced power supply lines associated with each cell.

It is another object of the present invention to provide a Josephson memory circuit made with simplified power source design.

It is another object of the present invention to provide a Josephson memory circuit which binary information is represented by the presence/absence or flow directions of the circulating current which flows through a closed superconducting loop.

Other objects and features of the present invention will become apparent from the following description and the accompanying drawings.

According to one aspect of the present invention, there is provided a Josephson memory circuit comprising a closed superconducting loop having a first node and including a first Josephson gate, a first line connected to the first node, a second Josephson gate located so close to the superconducting loop as to electromagnetically couple with the superconducting loop, a second line located to electromagnetically couple to the first Josephson gate, and a third line connected to the second Josephson gate and located to electromagnetically couple to the first Josephson gate. The first Josephson gate has a control characteristic which is selected to switch the state thereof in response to coincidence of currents of predetermined levels $I_Y$, $I_{Y'}$ and $I_{X1}$ which are supplied to the first, second and third lines, respectively. The second Josephson gate has a control characteristic which is selected to switch the state thereof in response to coincidence of the current $I_Y$, a current of a predetermined level $I_{X0}$ supplied to the third line, and a persistent circulating current which flows through the superconducting loop in a predetermined direction.

In accordance with another aspect of the present invention, there is provided a Josephson memory circuit comprising a plurality of cells arranged in matrix of rows and columns and each having a closed superconducting loop with a first Josephson gate included therein, and a second Josephson gate located to electromagnetically couple to the superconducting loop, a plurality of first lines extending in parallel in the column direction and respectively connected to the superconducting loops of the cells associated to the respective columns, a plurality of second lines extending in parallel in the column direction and respectively located near the first Josephson gates of the cells associated to the respective columns to electromagnetically couple to the first Josephson gates, a plurality of third lines extending in the row direction and respectively connected to the second Josephson gates of the cells associated to the respective rows and located to electromagnetically couple to the first Josephson gates of such cells, and detectors respectively connected to the third lines and each detecting a state of the associated second Josephson gate. Each of the first Josephson gates has a control characteristic which switches a state thereof in response to coincidence of currents of predetermined levels $I_Y$, $I_{Y'}$ and $I_{X1}$ which are supplied to the first, second and third lines, respectively. Each of the second Josephson gates has a control characteristic which switches a state thereof in response to coincidence of the current $I_Y$, a current of a predetermined level $I_{X0}$ supplied to the third line, and a persistent circulating current which flows through the superconducting loop in a predetermined direction.

In the above aspect, the second line may be formed along the vicinity of the first Josephson gates of diagonally aligned ones of the cells (i.e. located to electromagnetically couple to the first Josephson gates).

In any one of the above aspects, binary information may be represented by the presence/absence or flow directions of a persistent circulating current in the superconducting loop by suitably designing the currents $I_Y$, $I_{X1}$ and $I_{X0}$. In this case, the currents $I_{X1}$ and $I_{X0}$ may be made equal in absolute value but different in polarity in order to simplify the power source arrangement.

BRIEF DESCRIPTION OF THE DRAWINGS

FIG. 1 is a diagram of one embodiment of the invention;

FIGS. 2A and 2B are diagrams of control characteristics of a Josephson write gate and a Josephson sense gate shown in FIG. 1;

FIG. 3 is a diagram of one application of the invention;

PREFERRED EMBODIMENTS OF THE INVENTION

Figure 4:
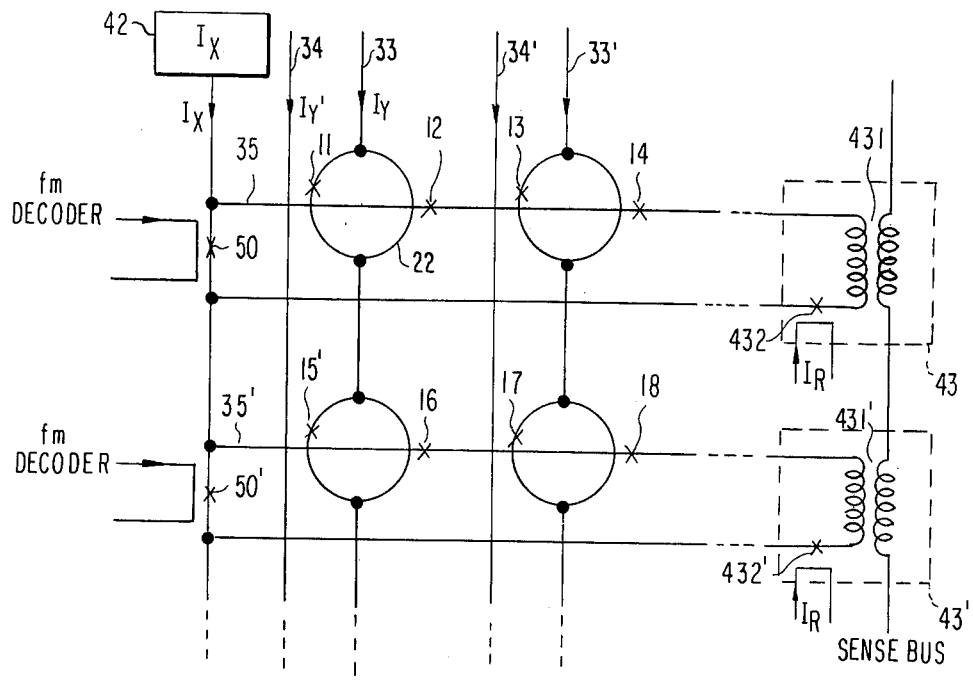
FIG. 4 is a detailed diagram of the structure shown in FIG. 3.

Referring to FIG. 1, a basic cell construction of a Josephson memory circuit of the invention is shown. A bias line 33 is connected to a closed superconducting loop which comprises a branch 21 including a Josephson write gate 11 and another branch 22 including no gates. A control line 34 is located adjacent to the write gate 11. A control/sense line 35 is provided in the vicinity of the write gate 11 to supply a bias current to a Josephson sense gate 12 provided near the branch 22. The gates 11 and 12 have control characteristics shown in FIGS. 2A and 2B, respectively. In each drawing, $I_C$ is the control current; $I_B$, the bias current; $I_{X0}$, the current fed to the row line 35 during a reading operation; and $I_{X1}$, the current fed to the same line 35 during a writing operation. The hatched area represents the zero-voltage state of the gate and the non-hatched area, the voltage state.

To write information, i.e., to hold a persistent circulating current $I_{circ}$ in the superconducting loop, the bias current $I_Y$ is fed to the bias line 33, the control current $I_{Y'}$ to the control line 34, and the write current $I_{X1}$ to the row line 35. Then, a current $KI_Y$ flows through the branch 21 and a current $(1-K)I_Y$ through the branch 22, where K is a ratio of the self-inductance $L_{22}$ of the branch 22 to the sum of the self-inductance $L_{22}$ and a self-inductance $L_{21}$ of the branch 21, i.e., $K \equiv L_{22}/(L_{21}+L_{22})$. The write gate 11 supplied with the control current $(I_{Y'}+I_{X1})$ and the bias current $KI_Y$ is brought to the voltage state, as seen from FIG. 2A. Therefore, caused to flow through the branch 22 is a current $I_Y\text{-}I_{min}$ which is the difference between the bias current $I_Y$ and the remaining current $I_{min}$ flowing through the write gate 11. Thereafter, when all the currents $I_Y$, $I_{Y'}$ and $I_{X1}$ are made zero, the superconducting loop holds a clockwise circulating current $I_{circ}$ therein whereby data such as a "1" is written into the cell. In the meantime, the sense gate 12 remains in its zero-voltage state despite the bias current $I_{X1}$ and the control current $(1-K)I_Y$ initially supplied thereto (see FIG. 2B). This situation applies even after the transition of the write gate 11 from the zero-voltage to the voltage state, i.e., even when the write gate 11 is fed with a bias current $(KI_Y-I_{circ})$ and the sense gate 12 with the control current $(1-K)I_Y+I_{circ}$. This teaches that information can be written into the cell regardless of the state of the gate by the above-stated condition.

On the other hand, when the currents $I_{X1}$ and $I_{Y'}$ are supplied but not the current $I_Y$, the write gate 11 is switched to the voltage state according to the control characteristic shown in FIG. 2A. Therefore, interrupting the supply of the currents $I_{X1}$ and $I_{Y'}$ under such a condition will result in disappearance of the circulating current in the superconducting loop. This erases the information stored in the cell; the erasure being equivalent to writing a "0". It will be obvious from the control characteristic of FIG. 2A that the presence/absence of the circulating current does not matter at all for the above situation.

To read data out of the cell, whether or not the persistent circulating current $I_{circ}$ is flowing through the loop is determined. The present invention achieves this object by supplying the cell with the bias current $I_Y$ and read current $I_{X0}$. If the circulating current $I_{circ}$ has been held by the loop, a current $(1-K)I_Y+I_{circ}$ will flow through the branch 22 of the loop to switch the sense gate 12 to the voltage state, as seen from FIG. 2B. If the circulating current $I_{circ}$ has not been held, a control current $(1-K)I_Y$ will flow through the branch 22 to maintain the sense gate 12 in the zero-voltage state, as also seen from FIG. 2B. A detector 43 shown in FIG. 1 is adapted to sense such two different states of the sense gate 12, thereby reading information out of the cell. It will be noted that the supply of the read current $I_{X0}$ to the row line 35 does not affect the voltage state of the write gate 11 due to the characteristic shown in FIG. 2A.

It will be seen from the above that the basic cell in accordance with the present invention makes the whole memory circuit simple and highly integrated due to the omission of one line and one power source, compared to the conventional circuitry. Additionally, the basic cell readily improves the yield and uniformity in the characteristics of the products.

Referring to FIG. 3, there is shown an exemplary 2×2 array Josephson memory circuit which employs four basic cells A-D each having the construction shown in FIG. 1. Each of the cells A-D includes a write gate 11, 13, 15 or 17 and a sense gate 12, 14, 16 or 18. A bias line 33 is connected to a power source 40 and a bias line 33' to a power source 40', each power source supplying a bias current $I_Y$. The bias line 33 connects the superconducting loops of the cells A and C in series with each other, while the bias line 33' connects the superconducting loops of the other cells B and D in series with each other. Control lines 34 and 34' are respectively connected to power sources 41 and 41' which serve to supply a control current I$_{Y'}$. The control line 34 is provided near write gates 11 and 15 of the cells A and C, while the control line 34' is provided near write gates 13 and 17 of the cells B and D. Further, row lines 35 and 35' are respectively connected to power sources 42 and 42' which individually supply write/- read currents. The row line 35 is formed near the write gates 11 and 13 of the cells A and B and the row line 35' near the write gates 15 and 17 of the cells C and D. Also, the row lines 35 and 35' are so connected as to supply bias currents to sense gates 12 and 14 of the cells A and B and the sense gates 16 and 18 of the cells C and D, respectively. Detectors 43 and 43' are respectively connected to the ends of the row lines 35 and 35' in order to detect the states of their associated sense gates.

During a write operation, data is written into a cell in the matrix which is supplied with the currents I$_{X1}$, I$_Y$ and I$_{Y'}$. During a read operation, a cell supplied with the currents I$_{X0}$ and I$_Y$ is selected out of the matrix and the state of its sense gate is detected by the detector 43 or 43'.

A specific example of the memory circuit including the memory cell array shown in FIG. 3 is illustrated in FIG. 4. The power source 42 shown in FIG. 4 which supplies the write current I$_{X1}$ and read current I$_{X0}$ is adapted for bifunctioning as both of the power sources 42 and 42' of FIG. 3. Josephson gates 50 and 50' are adapted to supply currents for the selection of row direction memory cells out of the memory cells which are arranged in the matrix. Each Josephson gate 50 or 50' switches its state from the zero-voltage state to the voltage in response to coincident application of a control current which is the output of a decoder and a bias current which is the current I$_{X1}$ or I$_{X0}$. Upon transition of the gate 50 from the zero-voltage to the voltage state, the current I$_{X1}$ or I$_{X0}$ from the power source 42 flows through the line 35 or 35' for writing or reading information in the manner described. The line 35 forms a closed loop which extends through the primary winding of a transformer 431, which serves as the row direction detector 43, and then through a resetting Josephson gate 432 to terminate at the other end of the gate 50. Likewise, the line 35' forms a closed loop which extends through the primary winding of a transformer 431', which serves as the row direction detector 43', and then through a resetting Josephson gate 432' to terminate at the other end of the gate 50'. The secondary windings of the transformers 431 and 431' are connected in series to constitute a sense bus. The states of the sense gates 12 and 14 or those of the sense gates 16 and 18 are discriminated by determining whether or not a current is flowing through the secondary winding (sense bus) of the transformer 431 or 431'. That is, if the sense gate of a selected cell is in the zero-voltage state while the read current is flowing, a current will flow through the sense bus; if it is in the voltage state, no current will flow through the sense bus. Each of the resetting Josephson gates 432 and 432' functions to interrupt the persistent circulating current which flows through the closed loop formed by the line 35 or 35', in synchronism with read and write clock signals. In more detail, after the supply of the write current I$_{X1}$ or the read current I$_{X0}$, the gate 50 or 50' regains the zero-voltage state to cause its associated line 35 or 35' to complete a closed superconducting loop, so that the current I$_{X1}$ or I$_{X0}$ remains in the closed loop as the persistent circulating current. Thus, the Josephson gate 432 or 432' is supplied with a reset current I$_R$ as a control current to switch the state of the gate 432 or 432' from the zero voltage state to the voltage, thereby blocking the circulating current. The circuitry shown in FIG. 4 is a basic circuitry which is also applicable to other embodiments which will be described hereinafter.

Figure 5:
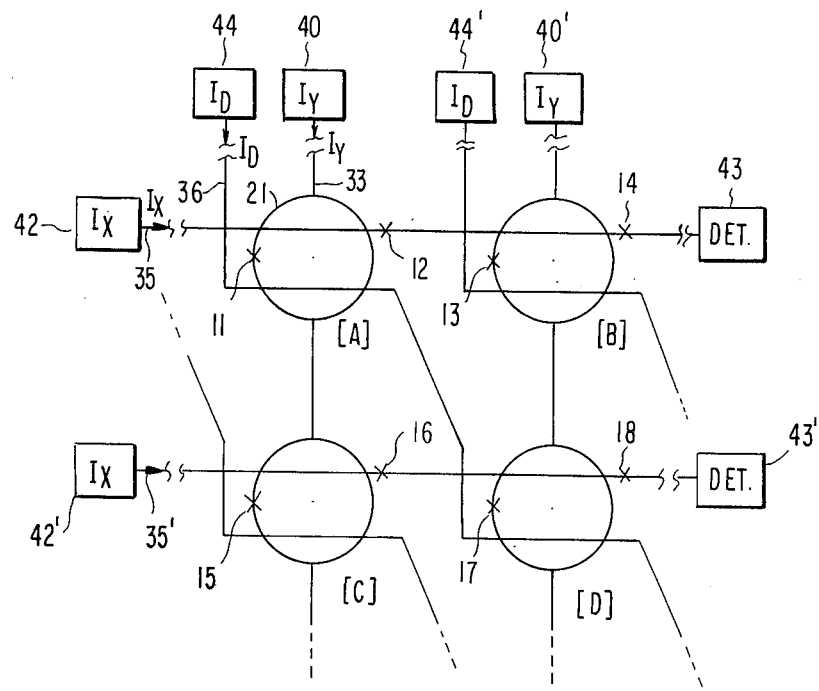
FIG. 5 is a diagram of another embodiment of the invention.

While binary information has been represented above by the presence or absence of a persistent circulating current in a cell, it may be represented also by the flow direction of the circulating current. This flow direction correspondence is readily achievable in the arrangement of FIG. 1 or 3 by enabling the bias current to selectively flow in the positive and negative directions and suitably designing the control characteristics of the write gate 11 and sense gate 12, control current I$_{Y'}$, write current I$_{X1}$ and read current I$_{X0}$. A practical embodiment employing such alternative correspondence between information and the circulating current will be described with reference to FIG. 5. In FIG. 5, when binary information to be stored is represented by a specific flow direction of the circulating current, coincident application of the currents I$_Y$ and I$_D$ is not employed for unselected cells in order to insure the operating margin of the write gate.

Figure 6A:
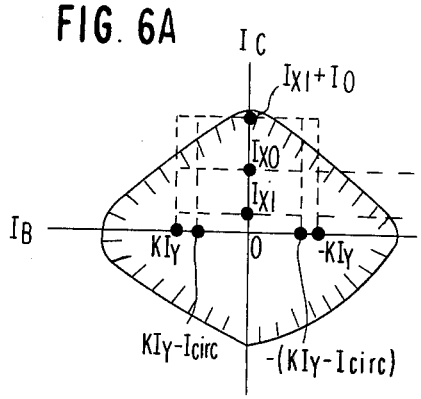
FIGS. 6A and 6B are diagrams of control characteristics of a write gate and a sense gate in each cell shown in FIG. 5.
Figure 6B:
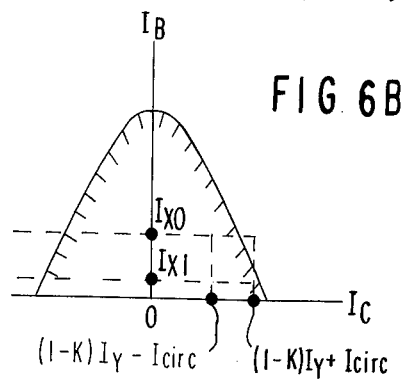

The construction shown in FIG. 5 is basically similar to that shown in FIG. 3, except for the difference in the control characteristics of write gates and the fact that in FIG. 5 control lines 36 and 36' do not extend vertically but pass near the write gates of diagonally aligned cells, e.g. write gates 11 and 17 of cells A and D. The control characteristics of write gates and sense gates are shown in FIGS. 6A and 6B, respectively.

Because all the cells share the same principle of operation, only the operation of the cell A will be described. To hold a clockwise circulating current +I$_{circ}$ in the closed superconducting loop of the cell A, a control current I$_D$ is fed through the control line 36, a write current I$_{X1}$ through the row line 35 and a bias current I$_Y$ through the bias line 33, all in coincidence. Then, the write gate 11 temporarily switches its state from the zero-voltage to the voltage according to the control characteristic thereof (FIG. 6A), so that a current I$_Y$-I$_{min}$ flows through the right-hand branch 22 of the closed loop of the cell A as has been the case with FIG. 1. Thereafter, all the currents are made zero to hold the persistent circulating current +I$_{circ}$ in the loop. Meanwhile, to hold a counterclockwise circulating current −I$_{circ}$ in the loop, the control current I$_D$ and write current I$_{X1}$ are supplied while, at the same time, a bias current −I$_Y$ is fed to the bias line 33. The result is the temporary transition of the write gate 11 to the voltage state due to its control characteristic shown in FIG. 6A, whereby a current −(I$_Y$−I$_{min}$) which is the difference between the bias current −I$_Y$ and the minimum current −I$_{min}$ of the gate 11 flows through the right-hand branch 22 of the loop in the opposite direction to the previously mentioned I$_Y$-I$_{min}$. Thereafter, all the currents are cut off to cause the counterclockwise circulating current −I$_{circ}$ to be held by the loop.

A direction of the circulating current held in the cell A is detected by the coincident application of the bias current I$_Y$ supplied to the bias line 33 and the read current I$_{X0}$ supplied to the row line 35. If +I$_{circ}$ is in the superconducting loop, (1−K)I$_Y$+I$_{circ}$ flows through the branch 22 to switch the sense gate 12 to the voltage state in accordance with the control characteristic shown in FIG. 6B. If $-I_{circ}$ is in the superconducting loop, $(1-K)I_Y-I_{circ}$ flows through the branch 22 keeping the sense gate 12 in the zero-voltage state due to the control characteristic of FIG. 6B. Discrimination between these two states of the sense gate 12 is achieved with the detectors shown in FIG. 4. In this instance, the current $I_{X0}$ through the row line 35 of the cell A does not cause the transition of the sense gate 11 to the voltage state by virtue of the characteristics depicted in FIG. 6A, because only the bias current $+KI_Y$ or $+(KI_Y-I_{circ})$ and control current $I_{X0}$ flow through the write gate 11.

While successfully cutting down the numbers of lines and power sources, the foregoing embodiments still require the write and sense currents to have different absolute values. Hereinafter will be described another embodiment of the present invention which enables write and read currents of the same absolute level to be used, thereby simplifying the circuit design of the power source section.

Figure 7A:
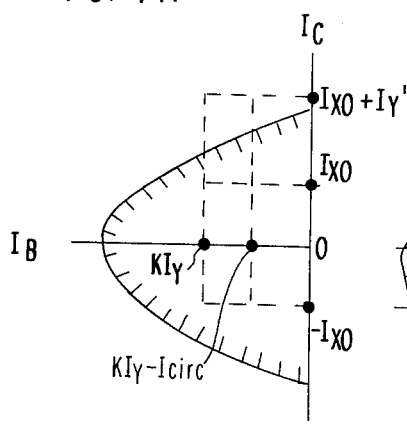
FIGS. 7A and 7B are diagrams of control characteristics of write and sense gates for use in still another embodiment of the present invention.
Figure 7B:
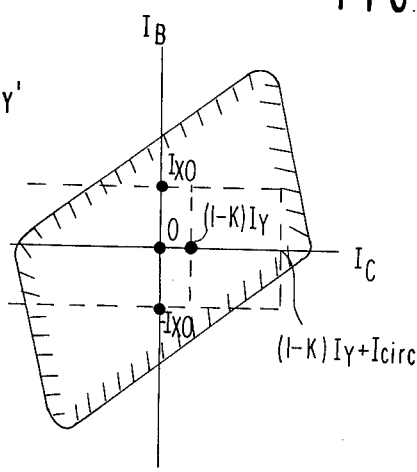

Described first is a memory circuit which represents binary information by the presence/absence of the circulating current. The basic construction of this memory is essentially similar to that shown in FIG. 3 except that the write gate 11 and sense gate 12 have such control characteristics as shown in FIGS. 7A and 7B, respectively, and that the write current $I_{X0}$ and read current $-I_{X0}$ are commonly supplied by the power source 42. The operation will therefore be described with reference to FIGS. 3, 7A and 7B.

To cause the cell A to hold the circulating current $I_{circ}$ regardless of its storage condition, the bias current $I_Y$, the control current $I_Y'$ and the write current $I_{X0}$ are simultaneously fed to the lines associated with the cell A. Then, due to the control characteristic shown in FIG. 7A, the write gate 11 supplied with the bias current $KI_Y$ (when $I_{circ}$ is absent) or the current $KI_Y-I_{circ}$ (when $I_{circ}$ is present) and the control current $I_{X0}+I_Y'$ has its state temporarily switched from the zero-voltage to the voltage. As a result, a current $I_Y-I_{min}$ flows into the branch 22. Thereafter, making all the currents $I_Y$, $I_Y'$ and $I_{X0}$ zero will cause the superconducting loop of the cell A to hold the circulating current $I_{circ}$.

To remove the circulating current $I_{circ}$, the currents $I_{X0}$ and $I_Y'$ are supplied but not the current $I_Y$ so that the write gate 11 is switched to the voltage state causing $I_{circ}$ to disappear. Thereafter, both the currents $I_{X0}$ and $I_Y'$ will be made zero.

Coincident application of the bias current $I_Y$ and control current $-I_{X0}$ discriminates whether or not the circulating current $I_{circ}$ has been held in the superconducting loop of the cell A. If so, a current $(1-K)I_Y+I_{circ}$ flows through the branch 22 of the cell A to set up the voltage state of the sense gate 12 according to the control characteristic of FIG. 7B; if not, a current $(1-K)I_Y$ flows through the branch 22 to maintain the sense gate 12 in the zero-voltage state due to the characteristic of FIG. 7A. The two different states are detected by the detector 43. The current $-I_{X0}$ which may be supplied here to the row line 35 is ineffective to cause transition of the write gate 12 to the voltage state, due to the characteristic of the write gate 12 shown in FIG. 7A.

Figure 8A:
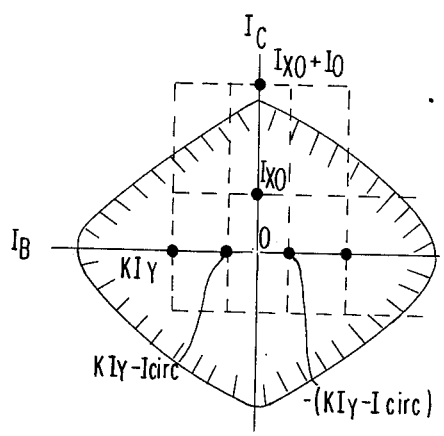
FIGS. 8A and 8B are diagrams of control characteristics of write and sense gates for use in yet another embodiment of the present invention.
Figure 8B:
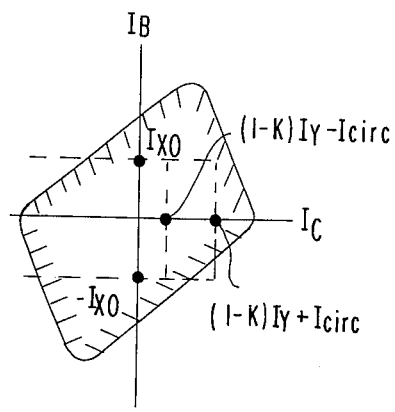

Referring to FIGS. 5, 8A and 8B, another embodiment of the present invention will be described in which binary information is represented by the persistent circulating current of either clockwise or counterclockwise and is written or read in response to currents having the same absolute level.

The embodiment which will be described with reference to FIGS. 5, 8A and 8B is the same in basic construction as that described with reference to FIGS. 5, 6A and 6B, except that the write and sense gates of each cell have control characteristics shown in FIGS. 8A and 8B, respectively, and that the power source 42 supplies a write current $I_{X0}$ and a read current $-I_{X0}$.

In order to flow the circulating current $+I_{circ}$ through the superconducting loop of the cell A regardless of the storage condition, the currents $I_D$, $I_{X0}$ and $I_Y$ are fed to switch the write gate 11 temporarily to the voltage state according to the characteristic shown in FIG. 8A. Then, a current $I_Y-I_{min}$ flows through the branch 22. Thereafter, the control current $I_D$, write current $I_{X0}$ and bias current $I_Y$ are all made zero so that the circulating current $+I_{circ}$ becomes held in the superconducting loop.

To hold $-I_{circ}$ regardless of the storage condition of the cell A, triple coincidence of the control current $I_D$ and currents $I_{X0}$ and $-I_Y$ temporarily switches the sense gate 11 to the voltage state according to the characteristic of FIG. 8A. Under this condition, a current $-(I_Y-I_{min})$ flows through the branch 22. This is followed by making all the currents $I_D$, $I_{X0}$ and $-I_Y$ zero, whereby $-I_{circ}$ is held in the superconducting loop. In both the writing operations described, the sense gate 12 is kept in the zero-voltage state due to the characteristic shown in FIG. 8B.

Coincident application of the bias current $I_Y$ and read current $-I_{X0}$ are used to determine a direction in which the circulating current $I_{circ}$ is flowing through the superconducting loop of the cell A. If $+I_{circ}$ has been held, a current $(1-K)I_Y+I_{circ}$ flows through the branch 22 and the sense gate 12 switches itself to the voltage state in accordance with the characteristic shown in FIG. 8B; if $-I_{circ}$, a current $(1-K)I_{Y-I_{circ}}$ flows through the branch 22 and the sense gate 12 remains in the zero-voltage state. Again, these two states are discriminated from each other by the detector 43. The current $-I_{X0}$ flowing through the row line 35 in the above situation cannot switch the write gate 11 to the voltage stage, due to the particular characteristic shown in FIG. 8A.

What is claimed is:

1. A Josephson memory circuit comprising: a closed superconducting loop having a first node and including therein a first Josephson gate; a first line connected to said first node; a second Josephson gate disposed in electromagnetically coupled relationship with said superconducting loop; a second line disposed in electromagnetically coupled relationship with said first Josephson gate; and a third line connected to said second Josephson gate and a detector for detecting a state of said second Josephson gate through said second Josephson gate and disposed in electromagnetically coupled relationship with said first Josephson gate, each of said Josephson gates having an input and an output and having a non-voltage state in which it presents a very low impedance between its input and output and a voltage state in which it presents a very high impedance between its input and output, said first Josephson gate being switched to the voltage state when current pulses of predetermined levels $I_Y$, $I_Y'$ and $I_{X1}$ are coincidentally supplied to said first, second and third lines, respectively, and said first Josephson gate being thereafter switched to the non-voltage state when said current pulses are no longer coincidentally supplied to said first, second and third lines to thereby set up a persistent current flowing in said superconducting loop, and said second Josephson gate being switched to the voltage state by the coincident supply of currents $I_X$ and $I_Y$ of predetermined levels when a persistent current flowing in said superconducting loop is set up.

2. The Josephson memory circuit as claimed in claim 1, in which said detector comprises a transformer having a primary winding connected in series with said second Josephson gate; a secondary winding; and means for deriving an output signal from said secondary winding.

3. A Josephson memory circuit comprising: a plurality of cells, arranged in a matrix of rows and columns and each having a closed superconducting loop with a first Josephson gate included therein; a second Josephson gate disposed in electromagnetically coupled relationship with each said superconducting loop; a plurality of first lines, extending in parallel in a column direction of said cells, which are connected in series within a given column and respectively connected to said superconducting loops of the cells associated with the respective columns; a plurality of second lines extending in parallel in said column direction and respectively disposed in electromagnetically coupled relationship with said first Josephson gates of the cells associated with the respective columns; and a plurality of third lines extending in a row direction intersecting said column direction and each connected to a respective detector for detecting a state of an associated second Josephson gate through said second Josephson gates of the cells associated with the respective rows and disposed in electromagnetically coupled relationship with said first Josephson gates of the cells in said row direction; each of said Josephson gates having an input and an output and having a non-voltage state in which it presents a very low impedance between its input and output and a voltage state in which it presents a very high impedance between its input and output, each of said first Josephson gates being switched to the voltage state when current pulses of predetermined levels $I_Y$, $I_Y'$ $I_{X1}$ are coincidentally supplied to said first, second and third lines, respectively, and said first Josephson gate being thereafter switched to the non-voltage state when said current pulses are no longer coincidentally supplied to said first, second and third lines to thereby set up a persistent current flowing in said superconducting loop, and each of said second Josephson gates being switched to the voltage state by the coincident supply of a current $I_Y$ and a current of a predetermined level $I_{X0}$ supplied to said third line when a persistent current flowing in said superconducting loop is set up.

4. The Josephson memory circuit as claimed in claim 3, in which said currents $I_{X1}$ and $I_{X0}$ are common in absolute level and opposite in polarity.

5. The Josephson memory circuit as claimed in claim 3, in which said current $I_Y$ is a current, selected in accordance with information to be stored in said memory circuit, out of two currents which are opposite in polarity to each other.

6. A Josephson memory circuit comprising: a plurality of cells arranged in a matrix of rows and columns and each having a closed superconducting loop with a first Josephson gate therein; a second Josephson gate disposed in electromagnetically coupled relationship with said superconducting loop; a plurality of first lines extending in a column direction of said cells and respectively connected to said superconducting loops of the cells associated with the respective columns; a plurality of second lines extending in a diagonal direction on said matrix and respectively disposed in electromagnetically coupled relationship with said first Josephson gates of the cells in said diagonal direction; and a plurality of third lines extending in a row direction which crosses said column direction and respectively connected to a detector for detecting a state of the associated second Josephson gate through said second Josephson gate and disposed in electromagnetically coupled relationship with the first Josephson gates of the cells in said row direction; each of said Josephson gates having an input and an output and having a non-voltage state in which it presents a very low impedance between its input and output and a voltage state in which it presents a very high impedance between its input and output, each of said first Josephson gates being switched to the voltage state when current pulses of predetermined levels $I_Y$, $I_Y'$ and $I_{X1}$ are coincidentally supplied to said first, second and third lines, respectively, and said first Josephson gate being thereafter switched to the non-voltage state when said current pulses are no longer conincidentally supplied to said first, second and third lines to thereby set up a persistent current flowing in said superconducting loop, and each of said second Josephson gates being switched to the voltage state by the coincident supply of said current $I_Y$ and a current of a predetermined level $I_{X0}$ supplied to said third lines when a persistent current flowing in said superconducting loop is set up.

7. The Josephson memory circuit as claimed in claim 6, in which said current $I_Y$ is a current, selected in correspondence with information to be stored in said memory circuit, out of two currents which are opposite in polarity to each other.

8. The Josephson memory circuit as claimed in claim 6, in which said currents $I_{X1}$ and $I_{X0}$ are common in absolute level and opposite in polarity.

* * * * *